United States Patent
Zhu et al.

(10) Patent No.: US 7,809,518 B2
(45) Date of Patent: Oct. 5, 2010

(54) METHOD OF CALIBRATING AN INSTRUMENT, A SELF-CALIBRATING INSTRUMENT AND A SYSTEM INCLUDING THE INSTRUMENT

(75) Inventors: Miao Zhu, San Jose, CA (US); John C. Eidson, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/336,553

(22) Filed: Dec. 17, 2008

(65) Prior Publication Data
US 2010/0148757 A1    Jun. 17, 2010

(51) Int. Cl.
  *G01R 35/00* (2006.01)
  *G01R 1/02* (2006.01)
(52) U.S. Cl. .......................... 702/88; 324/130

(58) Field of Classification Search ................ 702/88, 702/104; 73/765, 769; 178/18.04; 324/130
See application file for complete search history.

(56) References Cited

U.S. PATENT DOCUMENTS

| | | | | |
|---|---|---|---|---|
| 4,414,852 A | * | 11/1983 | McNeill | 73/765 |
| 4,870,559 A | * | 9/1989 | Hyatt | 700/1 |
| 6,650,107 B2 | * | 11/2003 | Bakharev | 324/202 |
| 7,012,983 B2 | * | 3/2006 | Buchwald et al. | 375/373 |

* cited by examiner

*Primary Examiner*—Bryan Bui

(57) ABSTRACT

An instrument including a device, a transducer and a calibration module is disclosed. The device produces a reference time and/or a reference frequency. The transducer converts the reference time and/or the reference frequency to a reference signal. The calibration module adjusts an output signal generated by the instrument and/or a result of a measurement taken by the instrument, based on the reference signal. A system including the instrument and a method of calibrating the instrument are also disclosed.

18 Claims, 5 Drawing Sheets

METHOD OF CALIBRATING AN INSTRUMENT, A SELF-CALIBRATING INSTRUMENT AND A SYSTEM INCLUDING THE INSTRUMENT

BACKGROUND

An instrument used in measurement applications is typically required to be certified as calibrated to a standard that is traceable to international standards. Often the calibration must be carried out to a degree of accuracy necessitating the frequent recalibration of the instruments at a standards laboratory.

Instrument calibration is intended to eliminate or reduce bias in an instrument's readings over a range for all continuous values in the range. For this purpose, a reference standard with a known value for at least one selected point in the range of interest is measured with the instrument in question. Then a functional relationship is established between the value of the reference standard and the corresponding measurement by the instrument.

Generally during calibration at a standards laboratory, the instrument is calibrated using one of several in-house standards that are traceable to the international standards. These traceable in-house standards are adjusted to be consistent with more accurate standards in the calibration hierarchy periodically, or they are generated following an established procedure using other traceable physical quantity. An example of the latter is the generation of an in-house DC voltage standard using a traceable frequency and a Josephson junction array.

In recent years, the development of the time/frequency dissemination techniques has made it easier to access the standard time/frequency that is traceable to international standards. An example is the dissemination of the standard time/frequency using the global positioning system (GPS). The weighted average frequency of the atomic frequency standards on each of a number of GPS satellites is monitored and corrected by the GPS ground stations so that the weighted average frequency from a GPS satellite is traceable to the international frequency standard. Thus one is able to access a traceable time/frequency standard using a GPS receiver in combination with a suitable local oscillator, e.g., a stable quartz crystal oscillator or a rubidium frequency standard. Similarly, the growing prevalence of network time protocols allows the distribution of this time within a facility. For example, the protocol IEEE 1588, which is based on the teachings of U.S. Pat. No. 5,566,180, Eidson et al., entitled "Method for recognizing events and synchronizing clocks", enables the transfer of time over Ethernet to accuracies approaching 1 ns or shorter.

In the international system (SI) base units, the time unit "second" has the smallest uncertainty, i.e., the time/frequency is the best measured physical quantity. Therefore, the unit "second" is used to define several other Si units such as the meter, volt, and ampere. Consequently, one is able to generate the required standard physical quantities using a traceable standard time/frequency. It would be advantageous to exploit the generation of such physical quantities for calibration purposes.

BRIEF DESCRIPTION OF DRAWINGS

The invention will be better understood with reference to the drawings, in which.

DETAILED DESCRIPTION OF THE EMBODIMENTS

Figure 1:
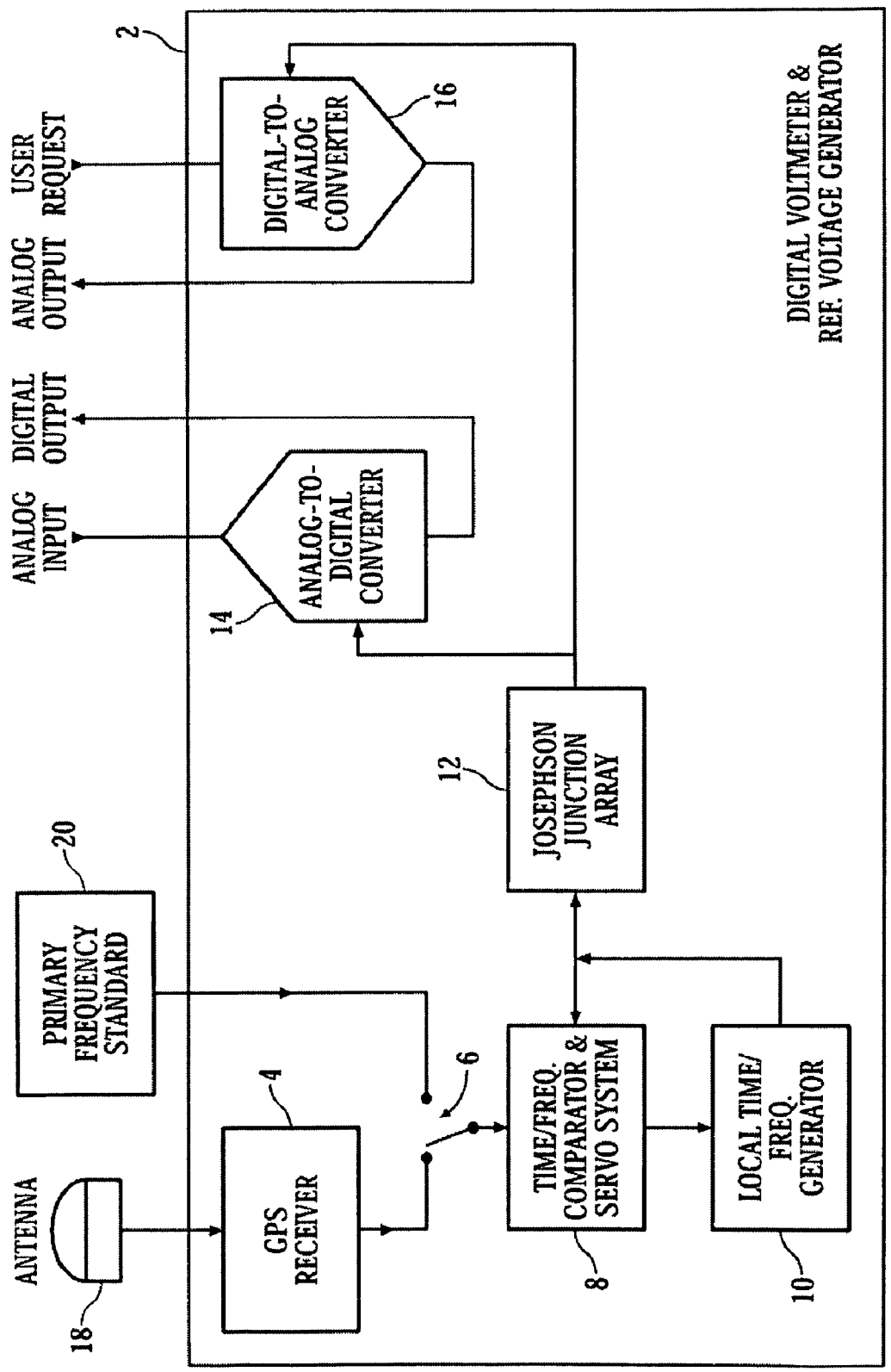
FIG. 1 is a block diagram of a first self-calibrating instrument according to an embodiment of the invention.

As shown in the drawings for purposes of illustration, the invention may be embodied in a novel self-calibrating instrument. An existing instrument is required to be taken out of service to be brought to a standards laboratory for calibration. Referring to FIGS. 1-4, the self-calibrating instrument embodying the invention generally includes a device that produces a reference time, a reference frequency or both. The instrument further includes a transducer that converts the reference time and/or the reference frequency to a reference signal, and a calibration module that adjusts an output signal generated by the instrument and/or a result of a measurement taken by the instrument based on the reference signal. The reference signal serves as the ultimate source of authority for calibrating the instrument. This reference signal may or may not be a reference base for the unit of measurement. In situ calibration of the instrument is thus possible with little or no instrument downtime.

FIG. 1 shows a first instrument 2, more specifically a digital voltmeter and reference voltage generator (DVRVG), according to an embodiment of the invention. The first instrument 2 includes a GPS receiver 4, a switch 6, a time/frequency comparator and servo system 8, a local time/frequency generator 10, a Josephson Junction Array 12, an analog-to-digital convertor (ADC) 14 and a digital-to-analog convertor (DAC) 16. The GPS receiver 4 can be connected to an antenna 18 external to the first instrument 2 to receive GPS signals. Receiving the GPS signals allows the GPS receiver 4 to provide a 1 pulse per second (pps) timing signal and/or standard frequencies such as 1, 5, and 10 MHz at its output. The timing signal and the frequencies from the GPS receiver 4 are traceable to international standards. The time/frequency comparator and servo system 8 receives the time/frequency from the GPS receiver 4 and an output signal from the local time/frequency generator 10 to produce a correction signal at an output of the time/frequency comparator and servo system 8. The time/frequency comparator and servo system 8 may include a frequency synthesizer (not shown) so that the phase of two different frequencies can be compared to produce the correction signal. The local time/frequency generator 10 receives the correction signal. This correction signal steers the local time/frequency generator 10 to produce a reference time/frequency that is traceable to the international standards via the GPS signals. In this embodiment, the switch 6 can be switched to connect the time/frequency comparator and servo system 8 to the GPS receiver 4 as described above or, alternatively, to a high quality primary frequency standard 20 when, for example, no GPS signal is available where the first instrument 2 is located. The Josephson junction array 12 functions as a transducer to convert the traceable reference time/frequency from the local time/frequency generator 10 to a reference voltage signal in this embodiment. The Josephson junction array 12 converts the reference time/frequency to a highly reproducible reference voltage. Such a conversion guarantees that the tolerance requirement of the calibration of the first instrument 2 is met. The ADC 14 receives the reference voltage and a calibration module therein (not shown) calibrates the ADC 14 based on the reference voltage. The calibration module in the ADC 14 may include a programmable precision voltage divider, a precision amplifier, and an input signal switch. The ADC 14 produces a digital output value corresponding to the voltage of an analog input signal. Calibrating the ADC 14 involves adjusting this digital output value based on the reference voltage. This calibration may be performed immediately prior to each measurement to ensure measurement accuracy. Alternatively, the calibration may be performed after each pre-determined time interval to generate a new set of calibration coefficients for calibrating the first instrument 2.

The DAC 16 generates an analog output signal having a voltage that is based on a digital value entered into the first instrument 2. Calibrating the DAC 16 involves a calibration module (not shown) therein adjusting the voltage of the analog output signal based on the reference voltage. In another embodiment, the calibration of DAC 16 can be performed by routing the output of the DAC 16 to the input of the ADC 14 described above to obtain a digital value at the output of the ADC 14. The output of the ADC 14 can then be used to calibrate the DAC 16, more specifically, to adjust the output of the DAC 16 until the digital value at the output of the ADC 14 equals the digital value entered. It should be noted that calibration of instruments for generating a signal with other characteristics, such as current, frequency and phase, or measuring such signal characteristics, impedance and power is also possible.

Figure 2:
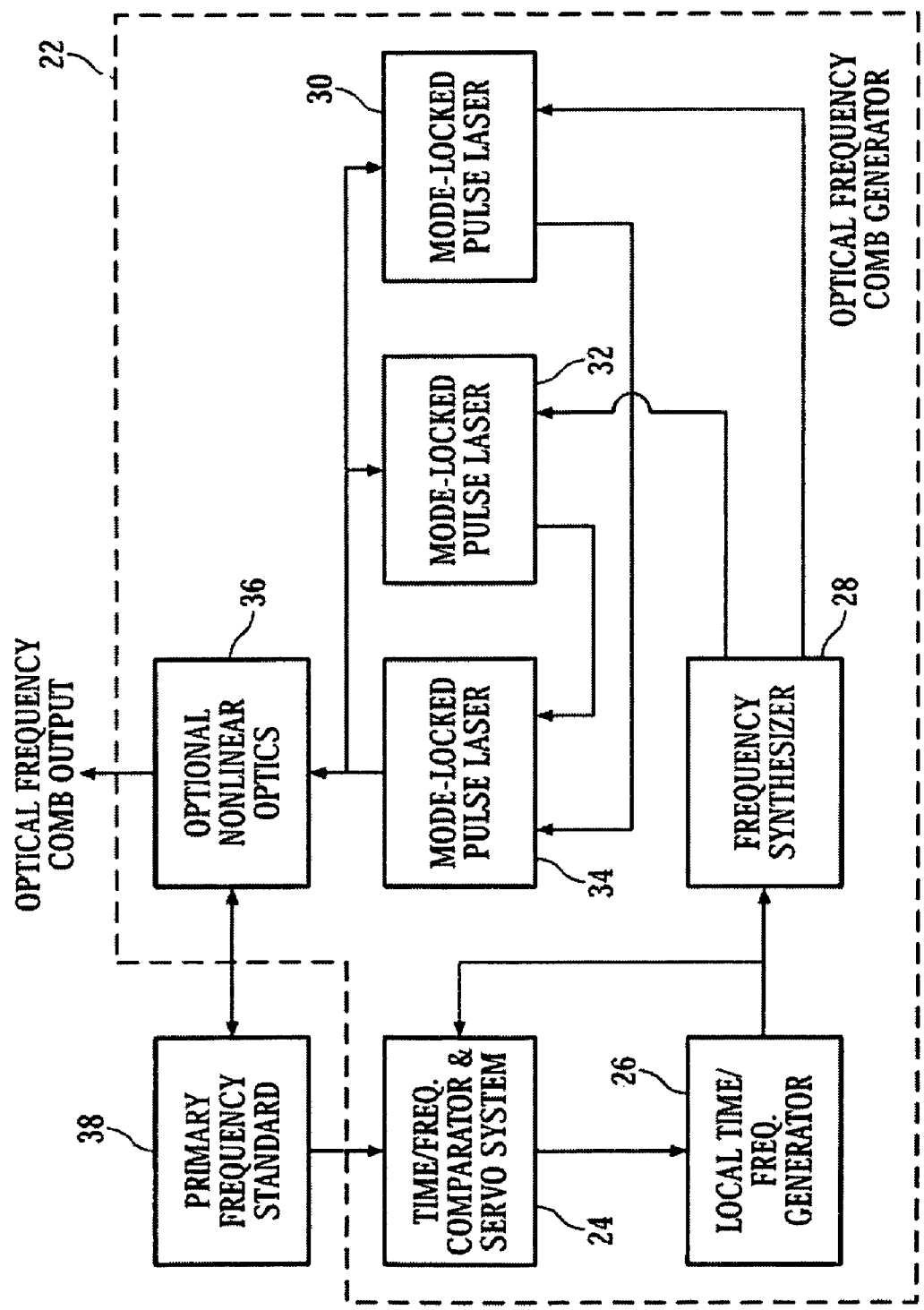
FIG. 2 is a block diagram of a second self-calibrating instrument according to another embodiment of the invention.

FIG. 2 shows a second instrument 22, more specifically an optical frequency comb generator, according to another embodiment of the invention. The second instrument 22 includes a time/frequency comparator and servo system 24, a local time/frequency generator 26, a frequency synthesizer 28, an offset frequency measurement and servo module 30, a repetition frequency measurement and servo module 32, a mode-locked pulse laser 34 and optional nonlinear optics 36. The second instrument 22 is shown connected to a primary frequency standard source 38 that delivers a traceable time/frequency standard to the second instrument 22. However, it should not be construed to be limited as such. Those skilled in the art would readily understand that it is possible for the second instrument 22 to also receive a standard time/frequency via other means, including but not limited to those shown in FIG. 1. The time/frequency comparator and servo system 24 receives signals from both the primary frequency standard source 38 and the local time/frequency generator 26 to produce a correction signal at its output. The local time/frequency generator 26 receives the correction signal. This correction signal steers the local time/frequency generator 26 to produce a reference time/frequency that is traceable to the primary frequency standard. In this second instrument 22, the frequency synthesizer 28 functions as a transducer to convert the reference time/frequency from the local time/frequency generator 26 to a first reference signal of a first frequency and a second reference signal of a second frequency. The repetition frequency measurement and servo module 32 receives the first reference signal from the frequency synthesizer 28 and an output laser beam of the mode-locked pulse laser 34. A calibration unit (not shown) of the repetition frequency measurement and servo module 32 generates a first control signal based on the measured laser repetition frequency of the output laser beam and the first reference signal. The offset frequency measurement and servo module 30 receives the second reference signal and the output laser beam of the mode-locked pulse laser 34. A calibration unit (not shown) of the offset frequency measurement and servo module 30 generates a second control signal based on the measured offset frequency in the laser spectrum of the output laser beam and the second reference signal. The first and the second control signals are used to control the operation of the mode-locked pulse laser 34 to thereby adjust its repetition frequency and its offset frequency. More specifically, the control signals control the cavity length and/or the dispersion characteristics of the mode-locked pulse laser 34 to adjust the characteristics of its output. The nonlinear optics 36 may be used to increase the spectral range of the output laser beam, such as from 700-900 nm to 500-1100 nm. The nonlinear optics 36 may also be used to shift the spectral range of the laser output. In this manner, the second instrument 22 is calibrated to produce a laser beam with an optical frequency comb that is traceable to the primary frequency standard 38.

Figure 3:
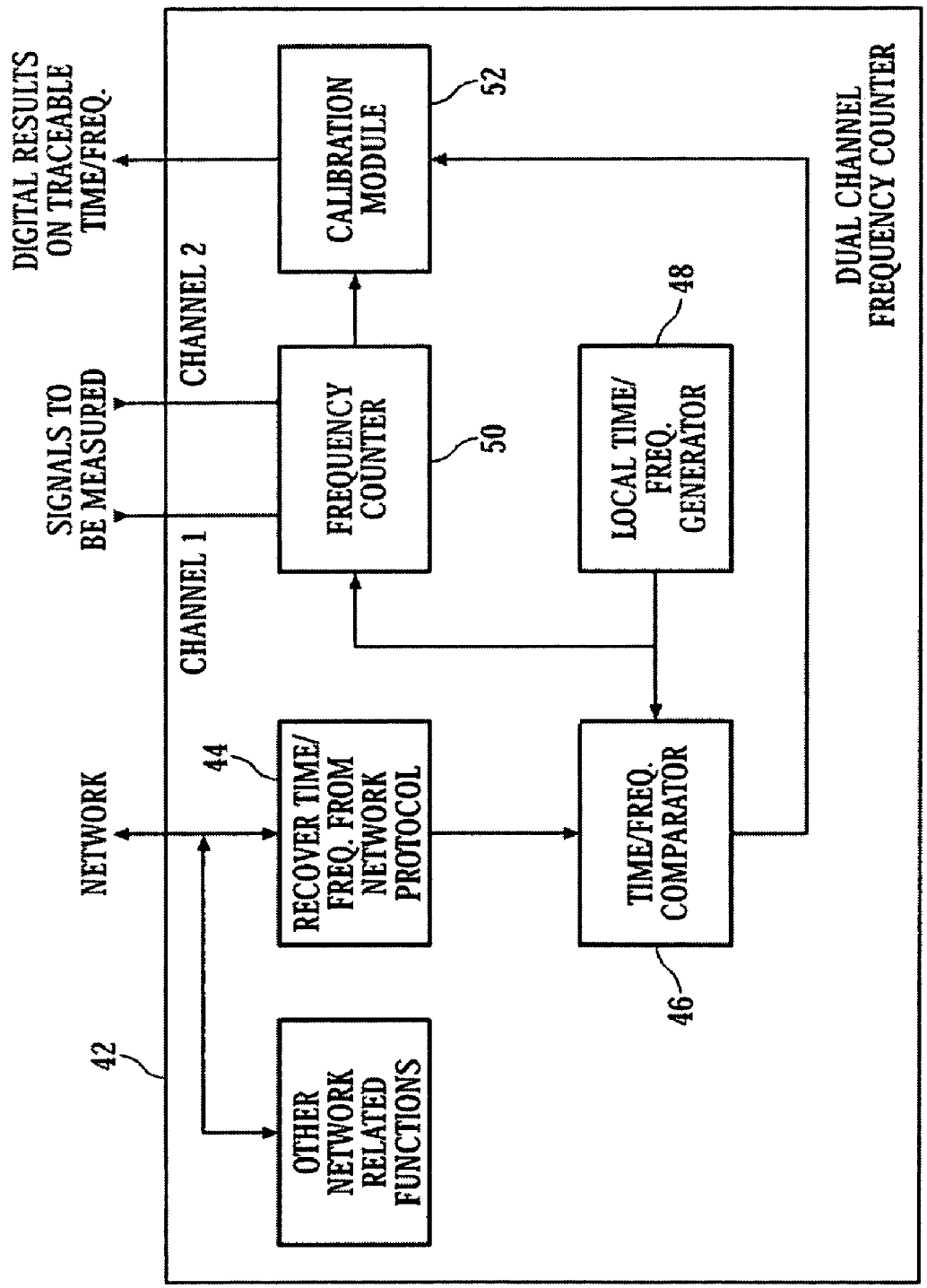
FIG. 3 is a block diagram of a third self-calibrating instrument according to yet another embodiment of the invention.

FIG. 3 shows a third instrument 42, more specifically a dual channel frequency counter, according to yet another embodiment of the invention. The third instrument 42 includes a time/frequency recovery module 44 for recovering time/frequency from transmissions over a network (not shown), a time/frequency comparator 46, a local time/frequency generator 48, a frequency counter module 50 and a calibration module 52. The time/frequency recovery module 44 obtains a reference time/frequency from transmissions over the network to which the third instrument 42 is connected to. The transmissions may be based on a protocol such as, but not limited to, the Precision Time Protocol (PTP) defined in the IEEE 1588 standard and the Network Time Protocol (NTP). The time/frequency comparator 46 compares a time/frequency generated by the local time/frequency generator 48 to the time/frequency extracted by the time/frequency recovery module 44 to produce a difference signal which in this case is a reference signal. The frequency counter module 50 receives up to two signals which are to be measured and outputs digital values corresponding to the frequencies of the two signals. These frequencies are measured based on the time/frequency that is output by the local time/frequency generator 48. The calibration module 52 adjusts the digital values based on the difference signal generated by the time/frequency comparator 46. In this manner the third instrument 42 is calibrated to produce a measurement result that is traceable to a time/frequency obtainable from the network.

Figure 4:
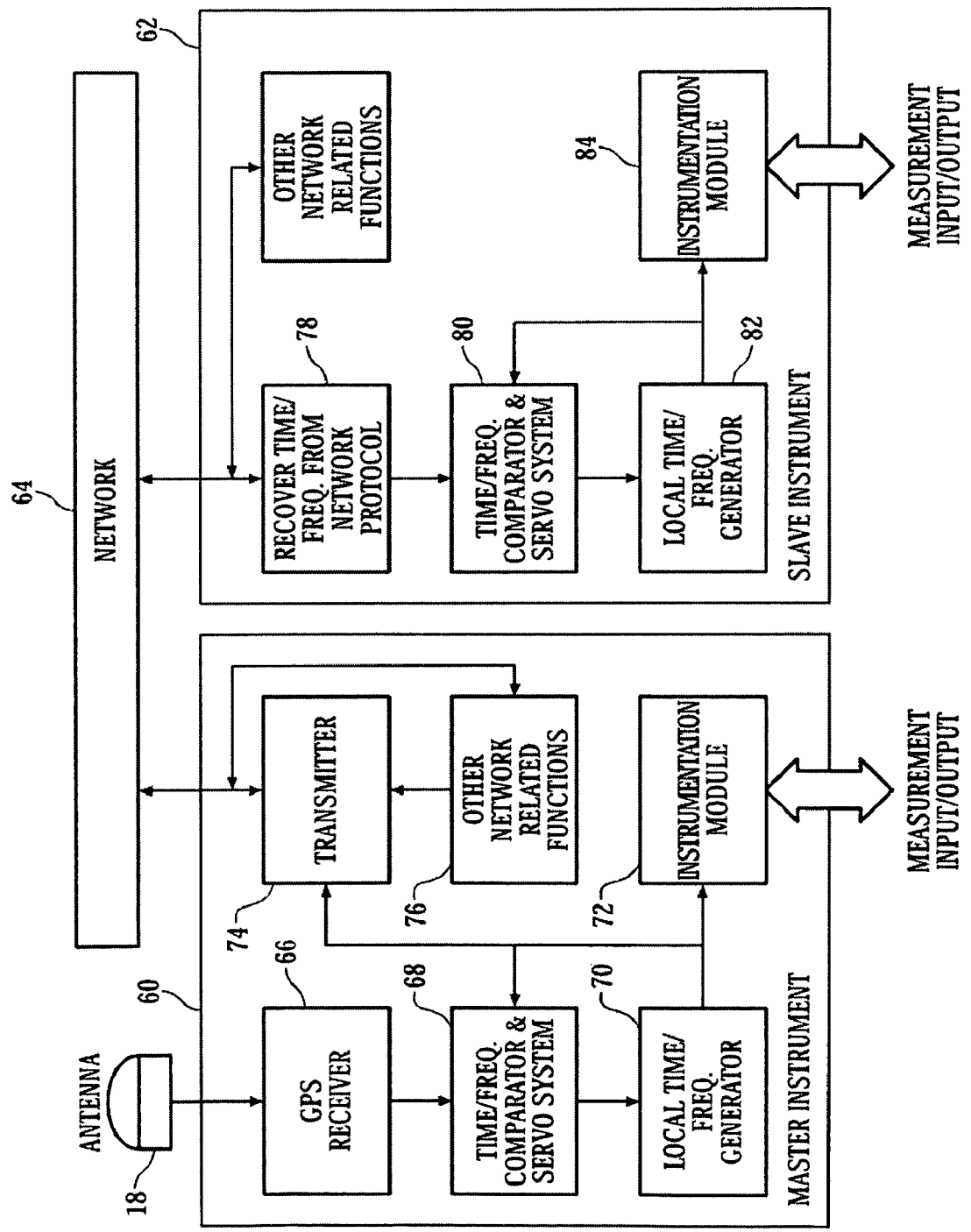
FIG. 4 is a drawing showing a fourth instrument and a fifth instrument in a master and slave configuration according to a further embodiment of the invention.

FIG. 4 shows two generic instruments, a fourth instrument acting as a generic master instrument 60 and a fifth instrument acting as a generic slave instrument 62, connected to each other over a network 64. The master instrument 60 includes a GPS receiver 66, a time-frequency comparator and servo system 68, a local time/frequency generator 70, an instrumentation module 72 which includes a transducer (not shown) and performs an instrument function, a transmitter 74 and a module 76 that performs other network related functions. The generic master instrument 60 may for example be the DVRVG in FIG. 1 modified to include the transmitter 74 and the module 76 that performs other network related functions. In such a case, the instrumentation module 72 may include the Josephson junction array 12, the ADC 14 and the DAC 16 shown in FIG. 1. As described above, the GPS receiver 66 receives GPS signals that are traceable to international standards via the antenna. The time/frequency comparator and servo system 68 receives the time/frequency signals from the GPS receiver 66 and an output signal from the local time/frequency generator 70 to produce a correction signal at the output of the time/frequency comparator and servo system 68. The local time/frequency generator 70 receives the correction signal which steers the local time/frequency generator 70 to produce a signal having a reference time/frequency that is traceable to international standards. The transducer of the instrumentation module 72 converts the reference time/frequency from the local time/frequency generator 70 to a reference signal. The instrumentation module 72 is calibrated based on this reference signal. The transmitter 74, which is an output unit, also receives the reference time/frequency signal. The transmitter 74 generates packets that include information of this reference time/frequency and transmits the packets onto the network 64. The transmitter 74 may either broadcast the packets or send the packets to specific recipients. The blocks 80, 82, 84 in the slave instrument 62 are the same as the corresponding blocks 68, 70, 72 in the master instrument 60. In some embodiments, the block 72 and the block 84 may have different measurement functions. However, in this embodiment, the slave instrument 62 may be another DVRVG as shown in FIG. 1 with the GPS receiver in FIG. 1 replaced by a time/frequency recovery module 78 similar to that shown in FIG. 3. As described above, the time/frequency recovery module 78 obtains the relevant time/frequency from packets transmitted over the network 64. The time/frequency comparator and servo system 80 in this slave instrument 62 receives the relevant time/frequency and an output signal from the local time/frequency generator 82 to produce a correction signal at the output of the time/frequency comparator and servo system 80. The time/frequency generator 82 receives the correction signal which steers the local time/frequency generator 82 to produce a signal having a reference time/frequency that is traceable to the time/frequency on the network 64. As described above, the transducer of the instrumentation module 84 converts the reference time/frequency from the local time/frequency generator 82 to a reference signal. The instrumentation module 84 is calibrated based on this reference signal. In this manner, calibration of this instrumentation module 84 of the slave instrument 62 is based on a reference signal that is traceable to international standards via the GPS signals received by the master instrument 60.

Although the instruments 2, 22, 42, 60, 62 above are described to receive an external signal from which the reference time/frequency is obtained, it is possible that the reference time/frequency is generated within each instrument 2, 22, 42, 60, 62 itself. A generator for generating the reference time/frequency may include an atomic beam frequency standard, a vapor cell atomic frequency standard, a stable oscillator or the like. Any known generator that generates a reference time/frequency with an uncertainty that meets the calibration requirements may be used.

According to another embodiment of the invention, there is provided a system including at least one of the instruments 2, 22, 42, 60, 62 described above. The system may include at least two instruments that are connected to each other, with one instrument providing the other instruments, either directly or indirectly, with the reference time/frequency or the reference signal. In one embodiment, the system may include a network via which the reference time/frequency or reference signal is transmittable. The network may be a synchronized network and the reference frequency produced in an instrument may be syntonized or synchronized to the frequency available on the synchronized network. Alternatively, the network may be one with a network protocol implemented thereon and the reference frequency produced in an instrument may be syntonized or synchronized to the frequency available as part of the network protocol. An example of such a network is described in a commonly owned co-pending U.S. patent application entitled "Synchronization of Low Noise Local Oscillator using Network Connection", Ser. No. 12/336,548, which is hereby incorporated herein by reference.

Figure 5:
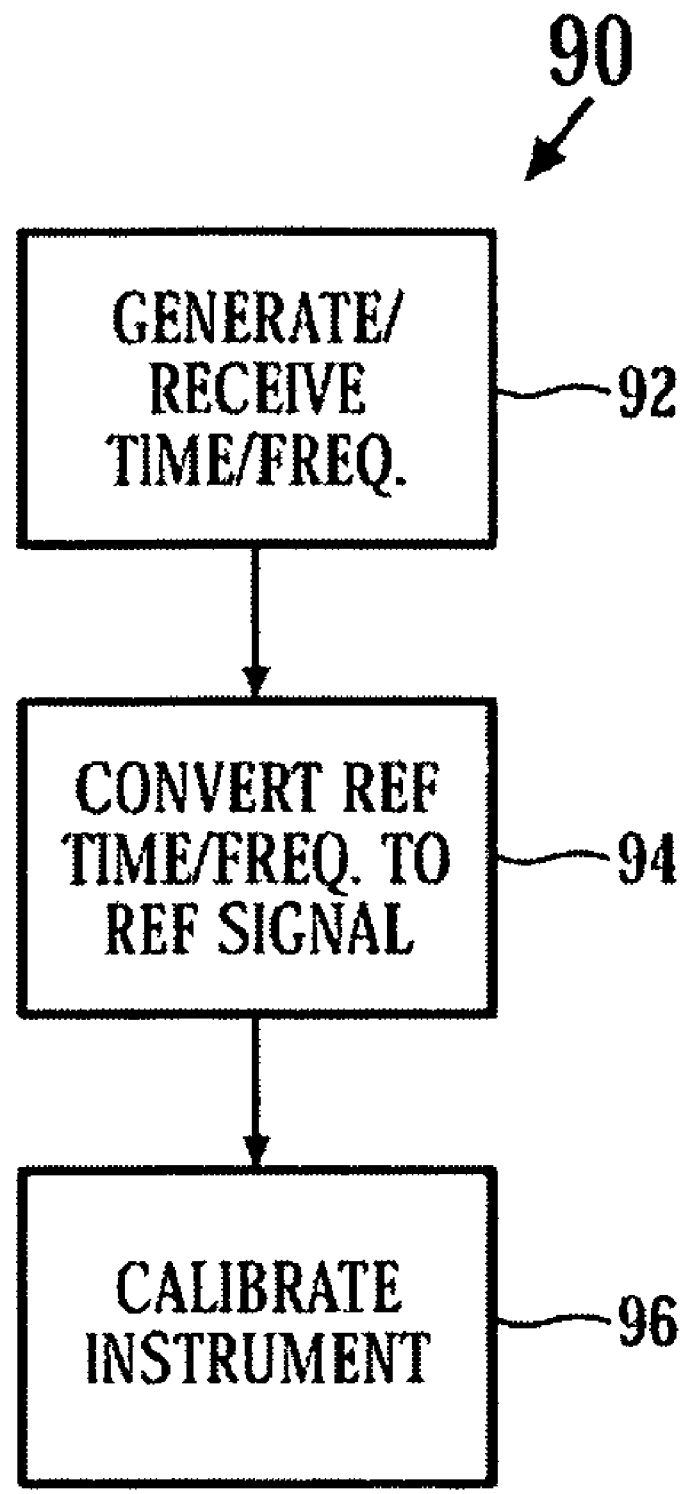
FIG. 5 is a flowchart showing a sequence of steps in each of the instruments in FIGS. 1-4 for allowing in situ self-calibration of the instrument.

Accordingly, each of the above instruments 2, 22, 42, 60, 62 is able to perform a method of calibrating the instrument. This method is next described with the aid of FIG. 5, which shows a sequence 90 of steps for implementing the method. The sequence 90 begins in a GENERATE/RECEIVE REF TIME/FREQ step 92 in the instrument, wherein the instrument generates a reference time or a reference frequency in the instrument, or receives a time or a frequency from an external source, such as those described above, to produce a reference time or a reference frequency respectively in the instrument. The sequence 90 next proceeds to a CONVERT REF TIME/FREQ TO REF SIGNAL step 94 wherein a transducer in the instrument converts the reference time or the reference frequency to a reference signal within the instrument. The sequence 90 ends in a CALIBRATE INSTRUMENT step 96, wherein a calibration module of the instrument adjusts an output signal generated by the instrument and/or a result of a measurement taken by the instrument, based on the reference signal. This calibration may involve obtaining a first reference signal and then generating other reference signals using the first reference signal. For example, when making a voltage measurement, the first reference signal may be a first reference voltage. A precision divider and a precision amplifier are then used to generate other reference voltages from the first reference voltage. A calibration curve that provides a functional relationship between the reference voltages and their corresponding measured values is obtained. A measurement made may then be corrected by an inverse of this calibration curve. In the case where the reference signal is a reference frequency, a phase-locked loop (PLL) based frequency synthesizer and/or a direct digital synthesizer (DDS), may be used to generate essentially any frequency based on the reference frequency. As long as the phase-locked-loop is designed and implemented to work correctly, the generated frequencies can be as accurate as the reference frequency.

Although the present invention is described as implemented in the above described embodiments, it is not to be construed to be limited as such. For example, standards source may include, among others, terrestrial low frequency sources (MSF, DCF77, WWVB, etc), timecode sources (IRIG, AFNOR, etc), and Ethernet sources (Network Time Protocol [NTP]). Other sources include a good oscillator disciplined via a link to a National Institute of Standards and Technology (NIST) or other national standards laboratory server and a source receiving traceable time via a pubic network such as a cable or telephone network.

As another example, the transducer may include, among others, a single Josephson junction device, a single charge transfer device, a single frequency electromagnetic field source, and a multiple frequency electromagnetic field source. The single frequency electromagnetic field source may include a laser. The multiple frequency electromagnetic field source may include a frequency comb generator or an optical frequency comb generator. Accordingly, the reference signal may include a signal having an AC or DC voltage, a signal having an AC or DC current, a single frequency electromagnetic field, a multiple frequency electromagnetic field or the like.

What is claimed is:
1. An instrument comprising:
 at least one of an output unit that generates an output signal and a measurement unit that performs a measurement to produce a measurement result;

a device that produces at least one of a reference time and a reference frequency;

a transducer that converts the at least one of the reference time and the reference frequency to a reference signal; and a calibration module that adjusts at least one of the output signal generated by the output unit and the result of a measurement taken by the measurement unit based on the reference signal.

2. An instrument according to claim 1, wherein the device that produces at least one of a reference time and a reference frequency comprises one of:

a generator that generates the at least one of a reference time and a reference frequency, and a receiver that receives at least one of a time and a frequency to produce the at least one of a reference time and a reference frequency respectively.

3. An instrument according to claim 2, wherein the generator comprises at least one of:

an atomic beam frequency standard;

a vapor cell atomic frequency standard; and a stable oscillator.

4. An instrument according to claim 1, wherein the transducer comprises at least one of:

a single Josephson junction device;

a Josephson junction array device;

a single charge transfer device;

a single frequency electromagnetic field source; and a multiple frequency electromagnetic field source.

5. An instrument according to claim 4, wherein the single frequency electromagnetic field source comprises a laser, the multiple frequency electromagnetic field source comprises at least one of a frequency comb generator and an optical frequency comb generator.

6. An instrument according to claim 1, wherein the reference signal comprises at least one of:

a signal having an AC and DC voltage;

a signal having an AC and DC current;

a single frequency electromagnetic field; and a multiple frequency electromagnetic field.

7. A system comprising:

an instrument comprising:

at least one of an output unit that generates an output signal and a measurement unit that performs a measurement to produce a measurement result;

a device that produces at least one of a reference time and a reference frequency;

a transducer that converts the at least one of the reference time and the reference frequency to a reference signal; and a calibration module that adjusts at least one of the output signal generated by the output unit and the result of a measurement taken by the measurement unit based on the reference signal.

8. A system according to claim 7, wherein the device that produces at least one of a reference time and a reference frequency comprises one of:

a generator that generates the at least one of a reference time and a reference frequency, and a receiver that receives at least one of a time and a frequency to produce the at least one of a reference time and a reference frequency respectively.

9. A system according to claim 8, further comprising a network to which the instrument is connected, and wherein the receiver receives the at least one of the time and the frequency from the network.

10. A system according to claim 9, wherein the network comprises a synchronized network and the frequency produced by the receiver is one of syntonized and synchronized to the frequency available on the synchronized network.

11. A system according to claim 9, wherein the network comprises a network with a network protocol implemented thereon and the frequency produced by the receiver is one of syntonized and synchronized to the frequency available as part of the network protocol.

12. A system according to claim 7, wherein the instrument further comprises another output unit that outputs at least one of the reference time and the reference frequency.

13. A system according to claim 12, further comprising a network to which the instrument is connected and wherein the at least one of the reference time and the reference frequency comprises at least one of a reference time and a reference frequency that is output onto the network using at least one of a synchronized network technology and a network protocol.

14. A method of calibrating an instrument comprising:

one of generating an output signal and making a measurement to produce a measurement result;

one of generating at least one of a reference time and a reference frequency, and receiving at least one of a time and a frequency to produce at least one of a reference time and a reference frequency respectively;

converting the at least one of the reference time and the reference frequency to a reference signal; and adjusting, using a calibration module, at least one of the output signal and the measurement result based on the reference signal.

15. A method according to claim 14, wherein generating the at least one of a reference time and a reference frequency comprises generating at least one of a reference time and a reference frequency that is one of syntonized and synchronized to a frequency available on a network to which the instrument is connected to.

16. A method according to claim 14, wherein receiving at least one of a time and a frequency comprises receiving the at least one of the time and the frequency from a network to which the instrument is connected to.

17. A method according to claim 14, further comprising outputting at least one of the reference time and the reference frequency.

18. A method according to claim 17, wherein outputting the at least one of the reference time and the reference frequency comprises outputting at least one of a reference time and a reference frequency onto a network using at least one of a synchronized network technology and a network protocol.

* * * * *